US012303930B2

(12) United States Patent
Han et al.

(10) Patent No.: US 12,303,930 B2
(45) Date of Patent: *May 20, 2025

(54) METHOD FOR MANUFACTURING HIGH-DENSITY IN-LINE CARBON NANOTUBE THIN FILM (71) Applicants: BEIJING HUA TAN YUAN XIN ELECTRONICS TECHNOLOGY CO., LTD, Beijing (CN); BEIJING INSTITUTE OF CARBON-BASED INTEGRATED CIRCUIT, Beijing (CN)

(72) Inventors: Jie Han, Beijing (CN); Hui Wang, Beijing (CN)

(73) Assignees: BEIJING HUA TAN YUAN XIN ELECTRONICS TECHNOLOGY CO., LTD, Beijing (CN); BEIJING INSTITUTE OF CARBON-BASED INTERGRATED CIRCUIT, Beijing (CN)

( * ) Notice: Subject to any disclaimer, the term of this patent is extended or adjusted under 35 U.S.C. 154(b) by 476 days.

This patent is subject to a terminal disclaimer.

(21) Appl. No.: 17/640,219

(22) PCT Filed: Sep. 4, 2020

(86) PCT No.: PCT/CN2020/113380
§ 371 (c)(1),
(2) Date: Mar. 3, 2022

(87) PCT Pub. No.: WO2021/043235
PCT Pub. Date: Mar. 11, 2021

(65) Prior Publication Data
US 2022/0332584 A1 Oct. 20, 2022

(30) Foreign Application Priority Data

Sep. 4, 2019 (CN) .......................... 201910831548.3
Sep. 4, 2019 (CN) .......................... 201910831550.0
(Continued)

(51) Int. Cl.
*B32B 9/00* (2006.01)
*B05C 3/02* (2006.01)
(Continued)

(52) U.S. Cl.
CPC .................. *B05C 3/02* (2013.01); *B05D 1/18* (2013.01); *B05D 7/24* (2013.01); *C01B 32/159* (2017.08);
(Continued)

(58) Field of Classification Search
CPC ..... Y10T 428/30; B82Y 30/00; C01B 32/168; C01B 32/159
(Continued)

(56) References Cited

U.S. PATENT DOCUMENTS 7,785,472 B2   8/2010   Murakoshi
10,519,333 B2  12/2019  Hladik
(Continued)

FOREIGN PATENT DOCUMENTS

CN    1922106 A     2/2007
CN    101505969 A   8/2009
(Continued)

OTHER PUBLICATIONS

International Search Report and Written Opinion of the International Searching Authority (with English-language translation) mailed Dec. 2, 2020, directed to International Patent Application No. PCT/CN2020/113380, 18 pages.
(Continued)

*Primary Examiner* — Daniel H Miller
(74) *Attorney, Agent, or Firm* — Emerson, Thomson & Bennett, LLC; Roger D. Emerson; Todd A. Fichtenberg (57) ABSTRACT

The present disclosure discloses a method for forming a high-density aligned carbon nanotube film. The method includes injecting a carbon nanotube solution into a container, and adding a dispersant to form a carbon nanotube-dispersant composite. The method also includes adding a substance that interacts with the carbon nanotube-dispersant composite and then dispersing the obtained carbon nanotube solution using water ultrasonic or probe ultrasonic to obtain a carbon nanotube solution containing a dispersant. Then a large-area or patterned high-quality aligned carbon nanotube film can be formed on a substrate by using processes such as pulling, injection dripping or printing. The method is low-cost and suitable for the preparation of large-area high-density aligned carbon nanotubes, and satisfies various
(Continued)

needs for industrial application of carbon-based integrated circuits.

12 Claims, 4 Drawing Sheets

(30) Foreign Application Priority Data

Sep. 4, 2019 (CN) .......................... 201910831824.6
Sep. 4, 2019 (CN) .......................... 201910831831.6

(51) Int. Cl.
| | | |
|---|---|---|
| *B05D 1/18* | (2006.01) | |
| *B05D 7/24* | (2006.01) | |
| *C01B 32/159* | (2017.01) | |
| *C01B 32/168* | (2017.01) | |
| *C01B 32/17* | (2017.01) | |
| *C01B 32/174* | (2017.01) | |
| *H10K 85/20* | (2023.01) | |
| *B82Y 30/00* | (2011.01) | |
| *B82Y 40/00* | (2011.01) | |
| *G03F 7/039* | (2006.01) | |
| *H10K 71/13* | (2023.01) | |

(52) U.S. Cl.
CPC ............ *C01B 32/168* (2017.08); *C01B 32/17* (2017.08); *C01B 32/174* (2017.08); *H10K 85/221* (2023.02); *B82Y 30/00* (2013.01); *B82Y 40/00* (2013.01); *C01B 2202/02* (2013.01); *C01B 2202/04* (2013.01); *C01B 2202/06* (2013.01); *C01B 2202/08* (2013.01); *G03F 7/039* (2013.01); *H10K 71/13* (2023.02); *Y10T 428/30* (2015.01)

(58) Field of Classification Search
USPC ........................................................ 428/408
See application file for complete search history.

(56) References Cited

U.S. PATENT DOCUMENTS

| | | |
|---|---|---|
| 2008/0047930 A1 | 2/2008 | Blanchet et al. |
| 2018/0261772 A1* | 9/2018 | Arnold ................. H10K 85/221 |

FOREIGN PATENT DOCUMENTS

| | | | | |
|---|---|---|---|---|
| CN | 102802772 | * | 11/2012 | ............. B82Y 30/00 |
| CN | 102802772 A | * | 11/2012 | ........... B01D 61/025 |
| CN | 104334494 A | | 2/2015 | |
| CN | 105152125 A | | 12/2015 | |
| CN | 110451484 A | | 11/2019 | |
| CN | 110482530 A | | 11/2019 | |
| CN | 110589804 A | | 12/2019 | |
| CN | 110611029 A | | 12/2019 | |

OTHER PUBLICATIONS

Gao et al., "Assembly of aligned semiconducting carbon nanotubes in organic solvents via introducing inter-tube electrostatic repulsion," *Carbon*, vol. 146, pp. 172-180, Jan. 31, 2019.

International Preliminary Report on Patentability directed to the related International Patent Application No. PCT/CN2020/113380, mailed on Mar. 8, 2022, 12 pages.

* cited by examiner

S1: a carbon nanotube solution is prepared, a dispersant is added, and dispersion is performed.

S2: a tackifier is added and loaded into the cartridge of the print head.

S3: the printing head is moved along the direction parallel to the substrate to perform the coating.

S4: the slurry coated substrate is vacuum-dried.

METHOD FOR MANUFACTURING HIGH-DENSITY IN-LINE CARBON NANOTUBE THIN FILM

CROSS-REFERENCE TO RELATED APPLICATIONS AND INCORPORATION BY REFERENCE

The present application claims the priority of the international application PCT/CN2020/113380 filed on Sep. 4, 2020, which claims the priority of the Chinese patent application CN201910831550.0 filed on Sep. 4, 2019 and titled "Method for preparing patterned carbon nanotube film", the priority of the Chinese patent application CN201910831824.6 filed on Sep. 4, 2019 and titled "Method for preparing carbon nanotube film by printing method", the priority of the Chinese patent application CN201910831548.3 filed on Sep. 4, 2019 and titled "Method for preparing carbon nanotube film by pulling method", and the priority of the Chinese patent application CN201910831831.6 filed on Sep. 4, 2019 and titled "Device and method for preparing carbon nanotube film". The entire contents of the above applications are incorporated into the present application by reference.

TECHNICAL FIELD

The present disclosure relates to the field of carbon nanotubes, in particular to a method for preparing a high-density aligned carbon nanotube film.

BACKGROUND

Carbon nanotubes are a new type of carbon material discovered in 1990's, and can be categorized into single-walled carbon nanotubes and multi-walled carbon nanotubes. The special structure of carbon nanotubes determines their special properties, such as high tensile strength and high thermal stability; With the change of the helical way of carbon nanotubes, carbon nanotubes can exhibit metallic or semiconducting properties. Due to their ideal one-dimensional structure and excellent properties in the fields of mechanics, electricity, and heat, carbon nanotubes have shown broad application prospects in interdisciplinary fields such as materials science, chemistry, and physics, and more and more attention has been paid to scientific research and industrial applications, but the prepared carbon nanotubes are generally in the form of particles or powders, which causes a lot of inconvenience to the applications for people.

At present, the Langmuir-Schaefer (LS) method can be used to prepare the carbon nanotube film, which was squeezed back and forth at a certain speed by the pushing and pulling plate; then, the carbon tube arrays on the solution can be transferred to the substrate in parallel by the method of Langmuir-Schaefer. Trenches can be dug to allow carbon tubes to enter the trenches. Ribbon-shaped carbon tubes can be prepared by using the evaporation principle. However, these preparation methods still have various deficiencies. The carbon nanotube film prepared by the LS method has large area inhomogeneity, and the carbon tube film is multi-layered, which has a negative impact on the electrical properties (transistor). Due to the repeated extrusion process, the carbon tubes will be stacked to form multiple layers, and this process cannot ensure that each site is truly uniform.

The disadvantage of using trenches to prepare carbon nanotubes is that the carbon nanotubes obtained by this method are not a continuous film, but strips, which are not suitable for industrialized large-area processing technology; in the method of using the evaporation principle, the minimum trench size can only be 70 nm, which has great limitations.

Therefore, there is currently a need for a method suitable for low-cost, large-area preparation of high-density aligned carbon nanotube film, and can achieve patterning and customization to meet various applications in the industrialization of carbon-based integrated circuits.

SUMMARY

The present disclosure aims to provide a method for preparing a high-density aligned carbon nanotube film, which is simple in structure, low-cost and suitable for large-area, patterned or customized high-density aligned carbon nanotube film, and at the same time, can effectively avoid the problem of uneven thickness of the carbon nanotube film.

The present disclosure provides a method for preparing a high-density aligned carbon nanotube film by a pulling method, mainly comprising the following steps:
 S1: a carbon nanotube solution is injected into a container;
 S2: a substrate is clamped on a pulling machine and immersed vertically in the carbon nanotube solution;
 S3: a sealing liquid that is immiscible with the carbon nanotube solution is injected along the substrate or the sidewall of the container.
 S4: the substrate is pulled up to form a carbon nanotube film parallel to the interface between the two-liquid layers on the substrate.

In some embodiments, the carbon nanotube solution is formed by dissolving carbon nanotubes in one or more halogenated hydrocarbons, preferably organic solvents such as chloroform, dichloroethane, trichloroethane, chlorobenzene, dichlorobenzene, and bromobenzene, etc.

In some embodiments, the carbon nanotubes are selected from one or more of single-walled carbon nanotubes, double-walled carbon nanotubes or multi-walled carbon nanotubes.

In some embodiments, the speed of pulling or inserting the substrate is 0.1 μm/sec to 20 μm/sec.

In some embodiments, the sealing liquid is one or more of polyol, amine solution or water.

In some embodiments, the substrate is glass, metal or plastic.

In some embodiments, the step of cleaning the film is included, wherein the cleaning solution is ethanol, isopropanol, acetone, toluene, xylene, and tetrahydrofuran.

In some embodiments, the carbon nanotube solution and a filling medium are injected into the container in the above mentioned step S1, and the filling medium includes liquid or solid substance, wherein the liquid is selected from a solvent or a mixture thereof that is dense and immiscible with the carbon nanotube solution, such as dichloroacetic acid, tetrafluoropropanol, heavy liquid, etc. The solid substance is selected from molecular sieves, polytetrafluoroethylene balls, and glass ball fillers. By mixing the filling medium into the carbon nanotube solution, the consumption of the carbon nanotube solution is greatly reduced, which has a huge cost advantage, and at the same time, the surface changes caused by the long-term immersion of the substrate in the solution can be avoided.

In addition, another aspect of the present disclosure provides a method for preparing a carbon nanotube film using a specific solution formulation and a pulling method. In the step S1, a carbon nanotube solution is injected into a container, and a dispersant is added to form a carbon nanotube-dispersant composite, and then a substance that interacts with the carbon nanotube-dispersant composite is added; then the means of water ultrasonic or probe ultrasonic is used for dispersing for 5 minutes; the substance that interacts with the carbon nanotube-dispersant composite is polyol or mercaptan, preferably 1%-70% 3-methyl-propanediol.

According to another aspect of the present disclosure, a method for preparing a high-density aligned carbon nanotube film on a patterned substrate mainly comprises the following steps:

The step of patterning the substrate: the substrate is cleaned, and then hydrophobic modification is performed on the substrate so that the contact angle of the substrate is greater than 90 degrees, and then a patterned hydrophilic area is formed on the hydrophobically modified substrate;

Self-assembly step: The carbon nanotube solution is dripped into the liquid addition area on the abovementioned substrate through a precision injection unit, so that the carbon nanotubes fill the strip of the hydrophilic area;

A drying step and a cleaning step are performed on the substrate after the self-assembly is completed.

In some embodiments, the substrate is treated with ultraviolet ozone (UVO) for 10 minutes when cleaning the substrate.

In some embodiments, hydrophobic modification is performed using the HMDS pretreatment system.

In some embodiments, the hydrophilic treatment includes:

A metal mask is covered on the hydrophobic modified substrate, and the substrate covered with the mask is treated by an ultraviolet ozone cleaning machine (UVO).

In some embodiments, wherein the hydrophilic treatment is photolithography.

In some embodiments, the carbon nanotube solution dripped in self-assembly step is formed by dissolving carbon nanotubes in one or more halogenated hydrocarbons, preferably organic solvents such as chloroform, dichloroethane, trichloroethane, chlorobenzene, dichlorobenzene, and bromobenzene, etc.

In some embodiments, wherein a dispersant is added to the carbon nanotube solution to form a carbon nanotube-dispersant composite, and then a substance that interacts with the carbon nanotube-dispersant composite is added to form a carbon nanotube solution with a dispersant, and then the carbon nanotube solution with a dispersant is dispersed for 5 minutes by means of water ultrasonic, probe ultrasonic or shaking table.

In some embodiments, the substance that interacts with the carbon nanotube-dispersant composite is polyol or mercaptan, preferably 1%-70% 3-methyl-propanediol.

In some embodiments, the injection slurry also includes a tackifier, and the tackifier is preferably polyethylene glycol or polystyrene.

In some embodiments, in the drying step, the drying temperature is room temperature to 120° C., preferably 40° C.-60° C., the pressure is 0.05 MPa-0.2 MPa, and the drying time is 0.5 h-2 h. Freeze drying or air drying is used as the drying method.

In some embodiments, in the cleaning step, the cleaning temperature is from room temperature to 100° C., and the cleaning agent is one or more of isopropanol, toluene, xylene, N-methylpyrrolidone or tetrahydrofuran.

According to another aspect of the present disclosure, a method for preparing a high-density aligned carbon nanotube film is provided, mainly comprising the following steps:

S1: a carbon nanotube solution is prepared, and a dispersant is added to form a carbon nanotube-dispersant composite, and a substance that interacts with the carbon nanotube-dispersant composite is added to form a carbon nanotube solution with a dispersant, and then the carbon nanotube solution with a dispersant is dispersed by means of water ultrasonic or probe ultrasonic;

S2: a tackifier is added to the carbon nanotube solution obtained in step S1, and is fully stirred and dispersed, and then the obtained printing slurry is loaded into the ink cartridge of the print head;

S3: the printing head is moved along the direction parallel to the substrate at a certain distance above the substrate to uniformly coat the printing slurry on the substrate;

S4: the slurry coated substrate is vacuum-dried and cleaned.

In some embodiments, the carbon nanotube solution is formed by dissolving carbon nanotubes in one or more halogenated hydrocarbons, preferably organic solvents such as chloroform, dichloroethane, trichloroethane, chlorobenzene, dichlorobenzene, and bromobenzene, etc.

In some embodiments, the carbon nanotubes are selected from one or more of single-walled carbon nanotubes, double-walled carbon nanotubes or multi-walled carbon nanotubes.

In some embodiments, the substance that interacts with the carbon nanotube-dispersant composite is polyol or mercaptan, preferably 1%-70% 3-methyl-propanediol, 1,3-butanediol or 1,3-propanediol.

In some embodiments, the carbon nanotube solution with a dispersant is dispersed for 5 minutes-10 minutes by means of water ultrasonic or probe ultrasonic.

In some embodiments, the tackifier is polyethylene glycol or polystyrene.

In some embodiments, the proportion of the tackifier is 5%-60%, preferably 10%.

In some embodiments, the distance between the print head and the substrate is 0.5 mm-2 mm.

In some embodiments, the moving speed of the print head is 0.5 μm/s to 100 μm/s, preferably 10 μm/s to 20 μm/s, and further preferably 20%.

In some embodiments, the cleaning solution is ethanol, isopropanol, acetone, toluene, xylene, and tetrahydrofuran.

In some embodiments, the substrate has a pattern.

Another aspect of the present disclosure provides a method for preparing a high-density aligned carbon nanotube film, wherein comprising:

S1: a carbon nanotube solution is injected into a container, and a dispersant is added to form a carbon nanotube-dispersant composite, and then a substance that interacts with the carbon nanotube-dispersant composite is added to form a carbon nanotube solution with a dispersant, and then the carbon nanotube solution with a dispersant is dispersed by means of water ultrasonic or probe ultrasonic.

S2: a substrate is clamped on a pulling machine and immersed vertically in the carbon nanotube solution obtained in S1;

S3: the substrate is pulled up to form a carbon nanotube film parallel to the solution interface on the substrate.

In some embodiments, the carbon nanotube solution is formed by dissolving carbon nanotubes in one or more halogenated hydrocarbons, preferably organic solvents such as chloroform, dichloroethane, trichloroethane, chlorobenzene, dichlorobenzene, and bromobenzene, etc.

In some embodiments, the carbon nanotubes are selected from one or more of single-walled carbon nanotubes, double-walled carbon nanotubes or multi-walled carbon nanotubes.

In some embodiments, the substrate is inserted in step S3 to form a carbon nanotube film perpendicular to the solution interface on the substrate.

In some embodiments, the speed of pulling or inserting the substrate is 0.1 μm/sec to 20 μm/sec.

In some embodiments, the means of water ultrasonic or probe ultrasonic is used for dispersing for 5 minutes.

In some embodiments, the above-mentioned substance that interacts with the carbon nanotube-dispersant composite is polyol or mercaptan, preferably 1%-70% 3-methyl-propanediol.

The present disclosure has the following beneficial effects:
 (1) When the present disclosure uses the above-mentioned pulling method to prepare the aligned carbon nanotube film, at the same time, the film-forming speed can be achieved by controlling the moving speed of the substrate, which is very easy to control; in addition, because the carbon nanotube solution does not need to be discharged or evaporated, there will be no loss and pollution, and it can be reused, which will greatly reduce the cost.
 (2) The present disclosure can design the pattern of the substrate as required, so as to form the corresponding hydrophobic area and hydrophilic area, and the patterned high-density aligned carbon nanotube film can be formed by utilizing the hydrophilic and hydrophobic properties. Through the patterned design of the substrate, more needs can be met and more industrial applications can be achieved.
 (3) The present disclosure can form a customized high-density aligned carbon nanotube film by using a special solution formulation combined with a printing method, which can meet more needs and achieve more industrial applications.

BRIEF DESCRIPTION OF THE DRAWINGS

The above and other objects, features and advantages of the present disclosure will be more clearly described by the description of the technical solutions of the present disclosure with reference to the drawings, in which.

DETAILED DESCRIPTION

Embodiments of the present disclosure will be described in detail below with reference to the drawings. In the various figures, the same components are designated by the same reference numerals, and the various parts of the figures are not drawn to scale. In addition, some common knowledge may not be shown. For the sake of simplicity, the semiconductor structure obtained after several steps can be depicted in one figure.

It should be understood that, in describing the structure of a device, when a layer or area is referred to as being "on" or "over" another layer or area, the layer or area can be directly on another layer or area, or other layers or areas are also included between the layer or area and another layer or area. And, if the device is turned over, the layer or area, will be "under" or "below" another layer or area.

In order to describe the situation directly on another layer or area, the expression "A is directly on B" or "A is on and adjacent to B" will be used herein. In this application, "A is located directly in B" means that A is located in B, and A is directly adjacent to B, rather than A located in a doped area formed in B.

Example 1

In this embodiment, the carbon nanotube solution 13 (FIG. 1) is prepared first by dissolving carbon nanotubes in one or more halogenated hydrocarbons, preferably organic solvents such as chloroform, dichloroethane, trichloroethane, chlorobenzene, dichlorobenzene, and bromobenzene, etc. The carbon nanotubes are selected from single-walled carbon nanotubes, double-walled carbon nanotubes or multi-walled carbon nanotubes. Of course, two or more of them can also be selected without affecting the quality of the film. It can be seen that with this method, the selection of carbon nanotubes is also relatively convenient, no special treatment is required, and it is convenient for industrialized production. The halogenated hydrocarbon is preferably chloroform, dichloroethane, trichloroethane, chlorobenzene, dichlorobenzene or bromobenzene.

Figure 1:
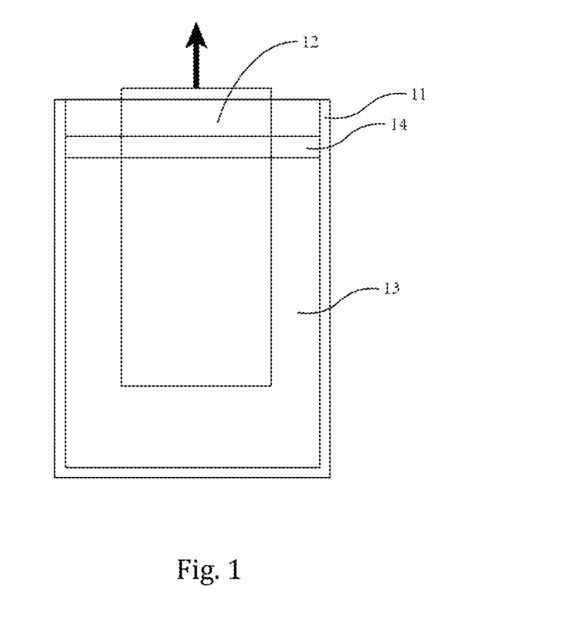
FIG. 1 shows a schematic diagram of the preparation of a carbon nanotube film by a pulling method.

A dispersant is added to the carbon nanotube solution 13 to form a carbon nanotube-dispersant composite in the carbon nanotube solution to complete the preparation of the carbon nanotube solution 13. The dispersant is a commonly used dispersant in the field, such as conjugated PCz (poly [9-(1-octylonoyl)-9H-carbazole 2,7-diyl]. Then, an additive that interacts with the carbon nanotube-dispersant composite is added to the above-mentioned carbon nanotube solution, wherein the additive that interacts with the carbon nanotube-dispersant composite is polyol or mercaptan, wherein polyol or mercaptan can be specifically selected from 1,2-propanediol, 1,3-propanediol, 3-methyl-propanediol, 1,3-butanediol, ethylene glycol, pentaerythritol, methyl mercaptan, ethyl mercaptan or 1,3-propane dithiol, and 1%-70% 3-methyl-propanediol is used in this embodiment. Then, the means of water ultrasound or probe ultrasound is used for dispersing for 5 minutes to form a carbon nanotube solution 16 with a dispersant.

Then a substrate 12 is clamped on a pulling machine, and vertically immersed in the carbon nanotube solution 16 with a dispersant, and the substrate 12 is pulled up by the pulling machine at a speed of 0.1 μm/sec to 20 μm/sec. Since the polyol or mercaptan and the carbon nanotube-dispersant have intermolecular force including hydrogen bond/van der Waals force/other non-covalent bonds and covalent bond or ionic bond force, with the change of the substrate position the carbon nanotubes on the air-liquid interface are aligned on the substrate 2 in order to form a high-density carbon nanotube aligned carbon nanotube film. Similarly, the substrate 12 can also be inserted into the container at a certain speed and immersed in the above-mentioned carbon nanotube solution. At this time, a carbon nanotube film perpendicular to the air-liquid interface is formed on the substrate 12.

After the pulling or insertion is completed, the subsequent cleaning step can be included. The film can be directly cleaned without additional peeling and other operations. The cleaning liquid can be selected from organic solvents such as ethanol, isopropanol, toluene, xylene, tetrahydrofuran, or N, N-dimethylformamide, etc.

Figure 6:
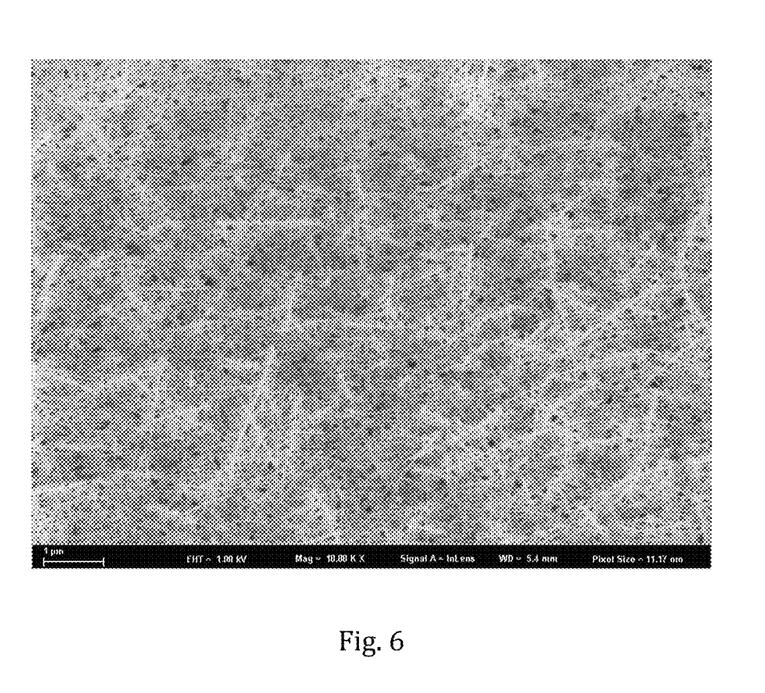
FIG. 6 shows the carbon nanotube film obtained according to the method of example 1 without adding polyol or mercaptan.
Figure 7:
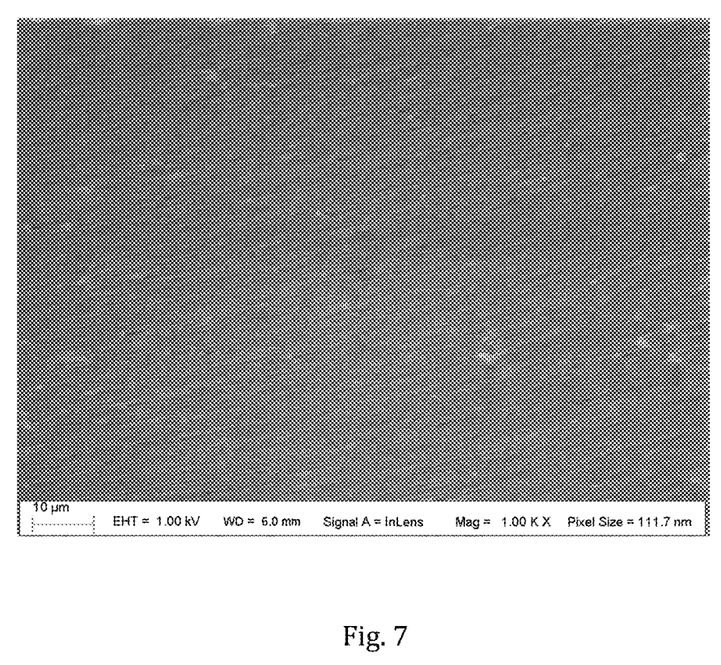
FIG. 7 shows the carbon nanotube film obtained by the method of example 1.

According to the method of this embodiment, by using a carbon nanotube solution with a special formula of polyol or mercaptan, and combined with a pulling or inserting method, a high-density aligned carbon nanotube array film covering the entire substrate can be prepared, and at the same time, the solution can be used repeatedly, with the advantages such as without volatilization pollution problems. In this embodiment, adding a substance that interacts with the carbon nanotube-dispersant composite into the composition of the carbon nanotube solution plays an important role in forming a high-density aligned carbon nanotube film. FIG. 6 shows the surface morphology of the film without adding polyol or mercaptan. It can be seen that the carbon nanotubes formed therein are disorderly, and no aligned carbon nanotube film is formed. FIG. 7 is the surface morphology of the carbon nanotube film formed by adding polyol. It can be clearly observed that the aligned carbon nanotube film is formed on the surface of the film. Its density is in the range of 120-200 CNT/micron, which can meet the requirements of the future industrialization of carbon-based integrated circuits.

Example 2

As shown in FIG. 1, in this embodiment, the carbon nanotube solution 13 is prepared first by dissolving carbon nanotubes in one or more halogenated hydrocarbons, preferably organic solvents such as chloroform, dichloroethane, trichloroethane, chlorobenzene, dichlorobenzene, and bromobenzene, etc. The carbon nanotube material is the same as in example 1.

A dispersant is added to the carbon nanotube solution 13 to form a carbon nanotube-dispersant composite in the carbon nanotube solution to complete the preparation of the carbon nanotube solution 13. The dispersant is a commonly used dispersant in the field, such as conjugated PCz (poly [9-(1-octylonoyl)-9H-carbazole 2,7-diyl]. Then, an additive that interacts with the carbon nanotube-dispersant composite is added to the above-mentioned carbon nanotube solution, wherein the additive that interacts with the carbon nanotube-dispersant composite is polyol or mercaptan, wherein polyol or mercaptan can be specifically selected from 1,2-propanediol, 1,3-propanediol, 3-methyl-propanediol, 1,3-butanediol, ethylene glycol, pentaerythritol, methyl mercaptan, ethyl mercaptan or 1,3-propane dithiol, and 1%-70% 3-methyl-propanediol is used in this embodiment. Then, the means of water ultrasound or probe ultrasound is used for dispersing for 5 minutes to form a carbon nanotube solution 16 with a dispersant.

Then a substrate 12 is clamped on a pulling machine, and vertically immersed in the carbon nanotube solution 16 with a dispersant, and a sealing liquid 14 that is immiscible with the carbon nanotube solution is injected along the substrate or the sidewall of the container. The above-mentioned substrate is selected from materials such as glass, metal, silicon wafer or plastic, etc., and is preferably a silicon wafer. In terms of shape, it can be flexible or rigid, which is mainly selected according to the shape and performance of the film. In addition, the above-mentioned substrate serves as the basis for the formation of the carbon nanotube film, and its shape can be set according to the required film layer shape, and can be rectangular, square, circular, or other patterns or shapes, which are not limited here.

The sealing liquid 6 can be one or more of polyol, amine solution or water. In this embodiment, polyol is preferably used. The substrate 12 is pulled up by a pulling machine at a speed of 0.1 μm/sec-20 μm/sec. Since the carbon nanotube solution and the sealing liquid 6 are immiscible with each other, there are intermolecular force including hydrogen bond/van der Waals force/other non-covalent bonds and covalent bond or ionic bond force between the two. As the position of the substrate changes, the position of the interface between the two-liquid layers on the substrate will also change. The carbon nanotubes on the interface are aligned on the substrate 2 in order to form a high-density carbon nanotube aligned carbon nanotube film. Similarly, the substrate 12 can also be inserted into the container at a certain speed and immersed in the above-mentioned carbon nanotube solution. At this time, a carbon nanotube film perpendicular to the interface between the two-liquid layers is formed on the substrate 12, and the carbon nanotubes in the underlying liquid will be adsorbed to the interface between the upper liquid and the lower liquid, and then laterally adsorbed to the substrate.

After the pulling or insertion is completed, the subsequent cleaning step can be included. The film can be directly cleaned without additional peeling and other operations. The cleaning liquid can be selected from organic solvents such as ethanol, isopropanol, toluene, xylene, tetrahydrofuran, or N, N-dimethylformamide, etc.

It can be seen that, according to the method of this embodiment, by using a carbon nanotube solution with a special formula of polyol or mercaptan, combined with a pulling or inserting method, and adding a layer of sealing liquid at the same time, a high-density aligned carbon nanotube array film covering the entire substrate can be prepared. The density of carbon nanotubes obtained can reach 200-250 CNT/micron. At the same time, the solution can be used repeatedly, with the advantages such as without volatilization pollution problems.

Example 3

Figure 2:
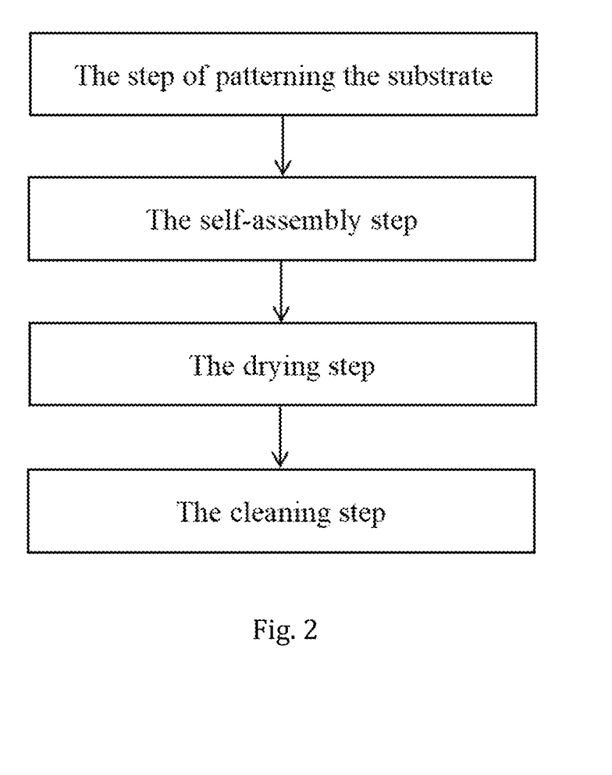
FIG. 2 shows a process flow diagram of the preparation of a carbon nanotube film on a patterned substrate.
Figure 3:
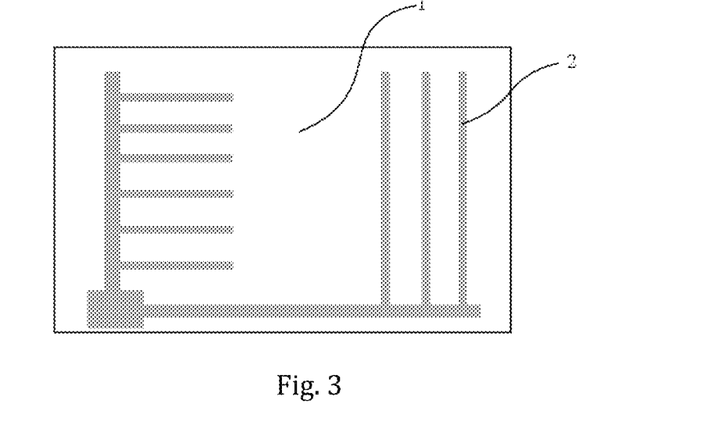
FIG. 3 shows a schematic diagram of the preparation of carbon nanotubes on a patterned substrate.

This embodiment describes a method for preparing a high-density aligned carbon nanotube film on a patterned substrate, as shown in FIG. 2-3, and mainly comprises the following steps:

(1) The step of patterning the substrate: first the substrate is cleaned, and then hydrophobic modification is performed on the substrate to form a hydrophobic zone 1 on the entire surface of the substrate so that the contact angle of the substrate is greater than 90 degrees, and then a patterned hydrophilic area is formed on the hydrophobically modified substrate 2.

The above-mentioned substrate is selected from materials such as glass, metal, silicon wafer or plastic, and is preferably glass. In terms of shape, it can be flexible or rigid, which is mainly selected according to the shape and performance of the film. In addition, the above-mentioned substrate serves as the basis for the formation of the carbon nanotube film, and its shape can be set according to the required film layer shape, and can be rectangular, square, circular, or other patterns or shapes, which are not limited here.

The main purpose of cleaning the substrate is to remove organic pollutants and silica floating layers on the surface of the substrate, and to improve the adhesion between the film and the substrate. The cleaning method can be ultraviolet ozone cleaning machine (UVO), high-temperature cleaning solvents, such as hydroxylamine solvents, acetone and ethanol ultrasonic cleaning, etc.

Preferably, the cleaning method is an ultraviolet ozone cleaning machine (UVO). UVO cleaning is a simple, economical and fast material surface cleaning equipment. It only needs to place the sample on the sample tray, close the hatch, set the relevant parameters according to the actual workpiece situation, and press run.

At present, the main applications of UVO cleaning machine are surface UV light cleaning and surface UV light modification. Surface UV light cleaning uses ultraviolet light and the ozone produced by it to photosensitive oxidation and decomposition of organic substances, so as to remove organic compounds (hydrocarbons) adhering to the surface of the object and obtain an ultra-clean surface.

Surface UV light modification uses ultraviolet light to irradiate the organic surface. While decomposing organic substances, after the ultraviolet light of 254 nm wavelength is absorbed by the surface of the object, the chemical structure of the surface layer is cut off, and the atomic oxygen generated by the action of photons combine with the cut-off surface molecules, and is transformed into a highly hydrophilic functional group (such as —OH, —CHO, —COOH), thereby improving the wettability of the surface.

The cleaned substrate is subjected to hydrophobic modification, wherein the hydrophobic modification includes hexamethyldisilazane (HMDS) treatment, alkyl hydrophobic group treatment, fluorocarbon hydrophobic group treatment, etc.

Preferably, the hydrophobic modification is treated with HMDS, and the chemical name of HMDS is hexamethyldisilazane. During the treatment, HMDS is applied to the surface of the substrate, and it can react to generate a siloxane-based compound by heating, which changes the wafer surface from hydrophilic to hydrophobic. The reaction principle of HMDS and silica substrate is that the water on the surface of silica substrate is removed by heating, and then HMDS reacts with OH— on the surface of silica substrate to form silyl ether on the surface of silica substrate and eliminate hydrogen bonds, making a polar surface a non-polar surface.

Specifically, the workflow of the HMDS treatment is as follows: turn on the vacuum pump to vacuum, and start to fill with nitrogen after the vacuum degree in the cavity reaches the first high target value, until the first low target value is reached, then vacuum and fill with nitrogen again. After reaching the target number of nitrogen filling, keep it for a certain period of time to make the silica substrate fully heated and reduce the moisture on the surface of the silica substrate. Then, the HMDS pretreatment oven is vacuumed again to reach a certain degree of vacuum, and filled with HMDS gas to reach the target value, so that the HMDS gas can fully react with the silica substrate. After the reaction is completed, vacuum again and fill with nitrogen, etc.

Through the hydrophobic treatment, the contact angle of the silica substrate is made greater than 90 degrees, which is mainly because the contact angle is less than 90 degrees, the hydrophobicity is not enough, it cannot be clearly distinguished from the definition of the hydrophilic area, and a clear pattern cannot be formed in the subsequent coating process.

Specifically, the hydrophilic treatment is performed on the hydrophobic treated substrate, wherein the area of hydrophilic treatment is not the entire substrate, but only for the part of the pattern, that is, only the area that needs to be patterned is subjected to hydrophilic treatment, and other areas remain hydrophobic, that is, the area of the hydrophilic treatment and the area of the pattern match.

The hydrophilic treatment method includes modification of hydrophilic groups, photolithography treatment, ultraviolet ozone cleaning machine (UVO) treatment, or attachment of a hydrophilic film, etc. The specific method to be selected can be selected according to various aspects such as line width and equipment conditions, etc. When the line width is greater than 5 microns, ultraviolet ozone cleaning machine (UVO) treatment is preferred. The specific process is as follows: as mentioned above, the hydrophilic treatment is only for the patterned area, so other areas are preferably covered with a metal mask on the hydrophobic modified substrate, and the shape of the mask is complementary to the shape of the pattern; that is, the mask plate covers the non-pattern area, and the pattern part is exposed. After the metal mask is covered, the substrate covered with the mask is treated with an ultraviolet ozone cleaning machine (UVO), for example, the substrate can be irradiated at 500 W for 5 minutes. When the line width is less than 5 microns, preferably use photolithography for hydrophilic treatment. First, spin-coat positive photoresist on the HMDS hydrophobized modified substrate, then expose and develop and fix the lines, then the fixed substrate is hit by oxygen plasma, and at the end clean the photoresist.

Using the above mentioned method to prepare a patterned substrate has the advantages of simple operation, industrialization promotion, and the formed substrate pattern is clear and sharp.

(2) Self-assembly step: The carbon nanotube solution is dripped into the liquid addition area on the above-mentioned substrate through a precision injection unit, so that the carbon nanotubes fill the strip of the hydrophilic area.

When preparing the carbon nanotube solution, it is formed by dissolving carbon nanotubes in one or more halogenated hydrocarbons, preferably organic solvents such as chloroform, dichloroethane, trichloroethane, chlorobenzene, dichlorobenzene, and bromobenzene, etc. The carbon nanotubes are selected from single-walled carbon nanotubes, double-walled carbon nanotubes or multi-walled carbon nanotubes. Of course, two or more of them can also be selected without affecting the quality of the film. It can be seen that with this method, the selection of carbon nanotubes is also relatively convenient, no special treatment is required, and it is convenient for industrialized production. The halogenated hydrocarbon is preferably chloroform, dichloroethane, trichloroethane, chlorobenzene, dichlorobenzene or bromobenzene. With the above-mentioned halogenated hydrocarbons, the solubility of carbon nanotubes is better.

Then, a dispersant is added to the carbon nanotube solution to form a carbon nanotube-dispersant composite in the carbon nanotube solution, and an additive that interacts with the carbon nanotube-dispersant composite is added to the above-mentioned carbon nanotube solution, wherein the additive that interacts with the carbon nanotube-dispersant composite is polyol or mercaptan, and the volume ratio of the additive to the carbon nanotube solution is 1%-70%. If the additive ratio is less than 1%, the wetting effect is not obvious, and delamination will still occur; if the additive ratio is higher than 70%, the film formation quality is not high, the density of carbon nanotubes is low, and the carbon layer is too thin. In order to form a higher quality film layer, the addition ratio is preferably 5% to 30%; further preferably 10%. 1%-70% 3-methyl-propanediol is used in this embodiment. Then the means of water ultrasonic (e.g., by using an ultrasonic water bath), probe ultrasonic (e.g., by using an ultrasonic probe) or a shaking table is used for dispersing for 5 min-10 min. In this embodiment, the dispersion time is 5 min to form the injection slurry of carbon nanotube solution with dispersant.

The above-mentioned injection slurry is injected into the substrate using a precision injection unit, and the specific precision injection unit can be a printing probe or a syringe, etc., which can precisely control the liquid volume. Specifically, the injection position of the precision injection unit on the substrate is the designed liquid addition area. Once the injection slurry is added, the injection slurry will quickly move to fill the designed strip.

(3) Drying step: further, the patterned substrate formed above is dried. When drying the film-formed substrate, the drying temperature is room temperature to 120° C., preferably 40° C.-60° C., the pressure is 0.05 MPa-0.2 MPa, and the drying time is 0.5 h-2 h in a vacuum environment. The drying method can be freeze-drying or air-drying. In this embodiment, the temperature is 50° C. and the vacuum is 0.1 MPa, and it is placed horizontally to dry for 1 h.

(4) Cleaning step: at the end, the dried patterned substrate is cleaned. The cleaning agent selected in the cleaning process is one or more of isopropanol, toluene, xylene, N-methylpyrrolidone or tetrahydrofuran. The temperature is room temperature to 100° C., preferably 70° C.-90° C., and the cleaning time is 10 minutes-60 minutes. In this embodiment, clean for 30 minutes by soaking or shaking at a temperature of 80° C.

The injection slurry can also include a tackifier, and by adding the tackifier, the viscosity of the carbon nanotube film can be increased, and the uniformity of the film can be promoted. Further, the tackifier can be polyethylene glycol or polystyrene, and the ratio of the tackifier is 10%-80%. The ratio of tackifier should not be too low. If it is less than 10%, the liquid will not spread well and slowly in the channel and will be evaporated. If it is too large, the content of carbon nanotubes will be reduced, and the density will be problematic. According to this embodiment, a high-density patterned carbon nanotube film can be obtained, and the film density is in the range of 120-250 CNT/micron.

Example 4

Figure 4:
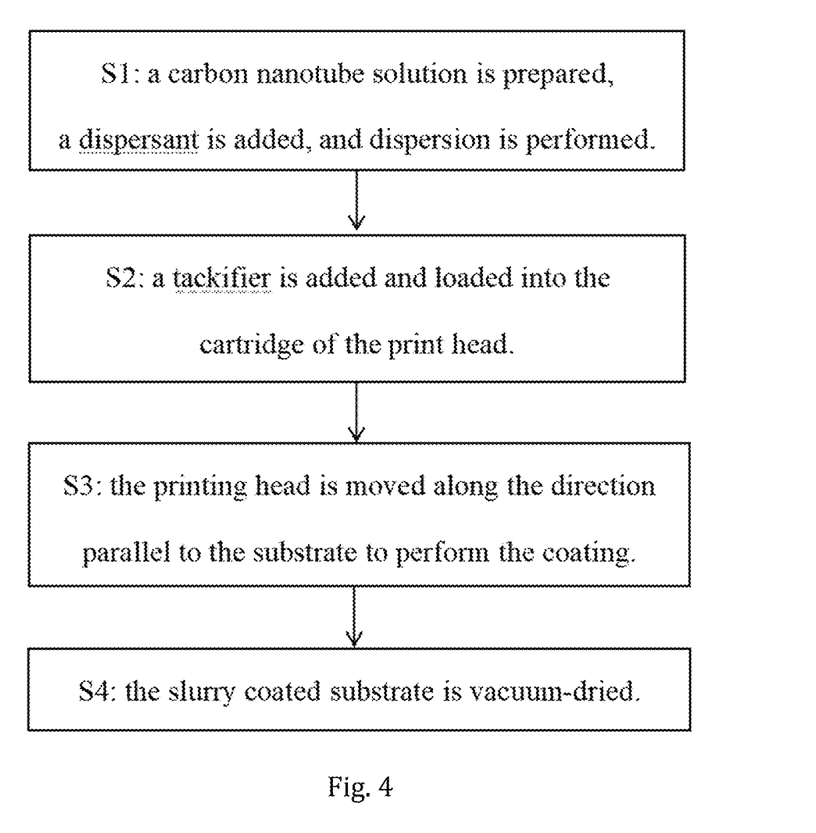
FIG. 4 shows a process flow diagram of the preparation of a carbon nanotube film by a printing method.
Figure 5:
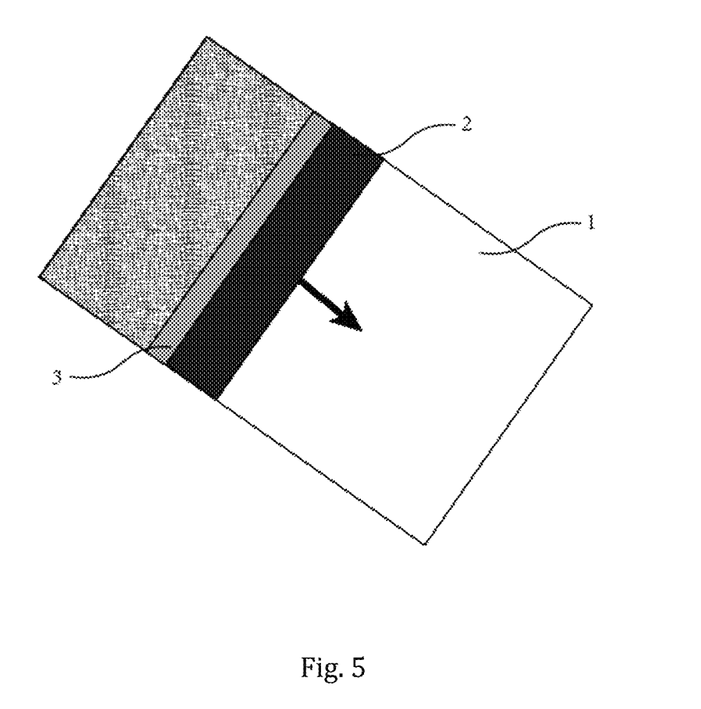
FIG. 5 shows a schematic diagram of the preparation of a carbon nanotube film by a printing method.

The process of preparing a high-density aligned carbon nanotube film by a printing method will be described below with reference to FIG. 4 and FIG. 5. As shown in FIG. 4, first, according to step S1, the carbon nanotube solution is prepared by dissolving carbon nanotubes in one or more halogenated hydrocarbons, preferably organic solvents such as chloroform, dichloroethane, trichloroethane, chlorobenzene, dichlorobenzene, and bromobenzene, etc. With the above mentioned halogenated hydrocarbons, the solubility of carbon nanotubes is better. The carbon nanotubes are selected from single-walled carbon nanotubes, double-walled carbon nanotubes or multi-walled carbon nanotubes. Of course, two or more of them can also be selected without affecting the quality of the film. It can be seen that with this method, the selection of carbon nanotubes is also relatively convenient, no special treatment is required, and it is convenient for industrialized production.

Then, a dispersant is added to the prepared carbon nanotube solution to form a carbon nanotube-dispersant composite, wherein the dispersant is a commonly used dispersant in the field, such as conjugated PCz (poly[9-(1-octylonoyl)-9H-carbazole 2,7-diyl]. Then, an additive that interacts with the carbon nanotube-dispersant composite is added, wherein the additive that interacts with the carbon nanotube-dispersant complex is polyol or mercaptan. Selecting polyol or mercaptan as an additive can form a mutually dispersed solution with the carbon nanotube solution, promote the wettability of carbon nanotubes, and facilitate the combination of the film layer and the substrate during the process of printing film to avoid delamination. Polyol or the mercaptan can be specifically selected from 1,2-propanediol, 1,3-propanediol, 3-methyl-propanediol, 1,3-butanediol, ethylene glycol, pentaerythritol, methyl mercaptan, ethyl mercaptan or 1,3-propane dithiol. In this embodiment the additive is preferably 3-methyl-propanediol. the volume ratio of the additive to the carbon nanotube solution is 1%-70%. If the additive ratio is less than 1%, the wetting effect is not obvious, and delamination will still occur; if the additive ratio is higher than 70%, the film formation quality is not high, the density of carbon nanotubes is low, and the carbon layer is too thin. In order to form a higher quality film layer, the addition ratio is preferably 5% to 30%; further preferably 10%. Then the means of water ultrasonic, probe ultrasonic or shaking table is used for dispersing for 5 min-10 min to form the carbon nanotube solution with dispersant. In this embodiment, the dispersion time is 5 minutes.

Then according to S2, adding a tackifier to the carbon nanotube solution obtained in step S1, and by adding the tackifier, the viscosity of the carbon nanotube film can be increased, and the uniformity of the film can be promoted. The tackifier can be polyethylene glycol or polystyrene. In this embodiment, polyethylene glycol is used as a tackifier to reduce surface tension and spread more uniformly. Then, the printing slurry is added into the printing ink cartridge, and the printing slurry must be dispersed before being added to the printing ink cartridge, otherwise, the printing head may be blocked during the printing process, as a result, the film cannot be formed or the film is not uniform. At the same time, when the printing slurry is added to the printing ink cartridge, it should not be too full to prevent overflow, and the added volume is preferably within ⅚ of the volume of the printing ink cartridge.

Then, printing and coating is performed according to step S3. As shown in FIG. 5, the printing head 2 is moved along the substrate 1. In order to ensure the uniformity of the film layer, the printing head 2 needs to be parallel to the substrate 1 and move along the parallel direction, and the printing slurry 3 is ejected from the printing head 2 to form a film layer with a larger area. During printing, the distance between the printing head 2 and the substrate 1 is 0.5 mm-2 mm. When the distance is less than 0.5 mm, the printing head 2 will be attached to the substrate 1, and the movement of the printing head 2 will be hindered; when the distance is greater than 2 mm, the printing slurry ejected by the printing head 2 cannot be controlled well and cannot be laid uniformly and orderly on the substrate, and the quality of the film layer is poor. Preferably, the distance between the printing head and the substrate is 1 mm-2 mm. When the distance between the printing head and the substrate is within this range, the formed film layer is more uniform. Further, the distance between the printing head and the substrate is preferably 1 mm, and when this distance is selected, the film layer formed is the most uniform and the quality of the film layer is the highest.

In order to ensure the quality of the film layer, the moving speed of the printing head must be kept at a constant speed to avoid sudden speed changes, resulting in changes in film thickness and uniformity, resulting in poor film quality. The moving speed of the printing head is preferably 0.5 μm/s to 100 μm/s, preferably 10 μm/s to 20 μm/s, and further preferably 20%. If the moving speed is too fast, the coating quality will be poor, and the film layer will be uneven; if the moving speed is too slow, the production efficiency will be low and the cost will be high, which is not in line with industrialization promotion.

After the printing and coating is completed, according to step S4, the slurry coated substrate is vacuum-dried, the drying temperature is from room temperature to 300 degrees Celsius, and the drying time can be from 5 minutes to 5 hours. Freeze-drying or air-drying can be used, and proceed cleaning. The cleaning solution can be selected from organic solvents such as ethanol, isopropanol, toluene, xylene, tetrahydrofuran, N,N-dimethylformamide, etc.

The substrates of the present disclosure may also have patterns. The pattern of the substrate can be designed as required, thereby forming the corresponding hydrophobic area and hydrophilic area, and utilizing the hydrophilic and hydrophobic properties, a film layer matching the substrate pattern can be achieved. Through the patterned design of the substrate, more needs can be met and more abundant carbon nanotube film layers can be achieved.

INDUSTRIAL PRACTICAL APPLICABILITY (1) When the present disclosure uses the above-mentioned pulling method and solution formulation to prepare the high-density aligned carbon nanotube film, at the same time, the film-forming speed can be achieved by controlling the moving speed of the substrate, which is very easy to control; in addition, because the carbon nanotube solution does not need to be discharged or evaporated, there will be no loss and pollution, and it can be reused, which will greatly reduce the cost.

(2) The present disclosure can design the pattern of the substrate as required, so as to form the corresponding hydrophobic area and hydrophilic area, and the patterned high-density aligned carbon nanotube film can be formed by utilizing the hydrophilic and hydrophobic properties. Through the patterned design of the substrate, more needs can be met and more industrial applications can be achieved.

(3) The present disclosure can form a customized high-density aligned carbon nanotube film by using a special solution formulation combined with a printing method, which can meet more needs and achieve more industrial applications.

Although the present disclosure has been described in detail above with general description and specific embodiments, some modifications or improvements can be made on the basis of the present disclosure, which is obvious to those skilled in the art. Therefore, these modifications or improvements made without departing from the spirit of the present disclosure fall within the scope of the claimed protection of the present disclosure.

The invention claimed is:
1. A method for forming a carbon nanotube film, comprising:
    injecting a carbon nanotube solution and a filling medium into a container, wherein the filling medium comprises a solid substance comprising molecular sieves, polytetrafluoroethylene balls, and glass ball fillers;
    clamping a substrate on a pulling machine;
    immersing the substrate vertically in the carbon nanotube solution;
    injecting, along the substrate or a sidewall of the container, a sealing liquid that is immiscible with the carbon nanotube solution;
    pulling the substrate up to form a carbon nanotube film on the substrate, wherein the carbon nanotube film is parallel to an interface between the sealing liquid and the carbon nanotube solution.
2. The method of claim 1, further comprising:
    dissolving carbon nanotubes in one or more halogenated hydrocarbons or organic solvents to form the carbon nanotube solution, wherein the organic solvents comprise chloroform, dichloroethane, trichloroethane, chlorobenzene, dichlorobenzene, and bromobenzene.
3. The method of claim 2, further comprising:
    selecting the carbon nanotubes from one or more of single-walled carbon nanotubes, double-walled carbon nanotubes or multi-walled carbon nanotubes.
4. The method of claim 1, further comprising:
    immersing or pulling the substrate at a speed between 0.1 μm/sec to 20 μm/sec.
5. The method of claim 1, wherein the injecting of the sealing liquid comprises injecting one or more of polyol, amine solution or water.
6. The method of claim 1, wherein the clamping, the immersing, or the pulling of the substrate comprises clamping, immersing or pulling a glass, a metal or a plastic.
7. The method of claim 1, further comprising cleaning the carbon nanotube film.
8. The method of claim 7, further comprising:
    cleaning the carbon nanotube film using a cleaning solution comprising ethanol, isopropanol, acetone, toluene, xylene, and tetrahydrofuran.
9. The method of claim 1, wherein the filling medium comprises a liquid instead of the solid substance.
10. The method of claim 9, wherein the liquid comprises a solvent or a mixture that is dense and immiscible with the carbon nanotube solution, the solvent or the mixture comprising dichloroacetic acid, tetrafluoropropanol, and heavy liquid.
11. The method of claim 1, further comprising:
    after injecting the carbon nanotube solution into the container, adding a dispersant to form a carbon nanotube-dispersant composite;
    adding a substance that interacts with the carbon nanotube-dispersant composite to form the carbon nanotube solution with a dispersant; and
    dispersing the carbon nanotube solution with the dispersant using water ultrasonic or probe ultrasonic.
12. The method of claim 11, wherein the adding of the substance that interacts with the carbon nanotube-dispersant composite comprises adding polyol, mercaptan, or 3-methyl-propanediol with a concentration between 1% and 70%.

* * * * *